United States Patent
Kadlec et al.

(10) Patent No.: US 8,574,409 B2
(45) Date of Patent: Nov. 5, 2013

(54) METHOD OF MAGNETRON SPUTTERING AND A METHOD FOR DETERMINING A POWER MODULATION COMPENSATION FUNCTION FOR A POWER SUPPLY APPLIED TO A MAGNETRON SPUTTERING SOURCE

(75) Inventors: Stanislav Kadlec, Prague (CZ); Frantisek Balon, Buchs SG (CH); Juergen Weichart, Balzers (LI); Bart Scholte van Mast, Azmoos (CH)

(73) Assignee: OC oerlikon Balzers AG, Balzers (LI)

(*) Notice: Subject to any disclaimer, the term of this patent is extended or adjusted under 35 U.S.C. 154(b) by 0 days.

(21) Appl. No.: 13/551,815

(22) Filed: Jul. 18, 2012

(65) Prior Publication Data

US 2012/0279851 A1 Nov. 8, 2012

Related U.S. Application Data

(62) Division of application No. 12/327,960, filed on Dec. 4, 2008, now Pat. No. 8,246,794.

(60) Provisional application No. 61/012,101, filed on Dec. 7, 2007.

(51) Int. Cl.
*C23C 14/00* (2006.01)
*H01L 21/00* (2006.01)

(52) U.S. Cl.
USPC ... 204/192.1; 438/5; 204/192.33; 204/192.12

(58) Field of Classification Search
None
See application file for complete search history.

(56) References Cited

U.S. PATENT DOCUMENTS

| | | |
|---|---|---|
| 5,325,019 A | 6/1994 | Miller et al. |
| 6,010,600 A | 1/2000 | Vernon et al. |
| 6,290,825 B1 | 9/2001 | Fu |
| 6,425,988 B1 | 7/2002 | Montcalm et al. |
| 6,668,207 B1 | 12/2003 | Montcalm et al. |
| 6,852,202 B2 | 2/2005 | Miller et al. |
| 7,138,343 B2 | 11/2006 | Kadlec et al. |
| 2006/0124446 A1 | 6/2006 | Zuger |
| 2007/0084715 A1 | 4/2007 | Kadlec et al. |

FOREIGN PATENT DOCUMENTS

WO 03/100819 A1 12/2003

*Primary Examiner* — Emily M Le
*Assistant Examiner* — Jenny Wu
(74) *Attorney, Agent, or Firm* — Pearne & Gordon LLP

(57) ABSTRACT

A method of magnetron sputtering, comprises rotating a magnet of a magnetron with an angular frequency $\omega$, and, during sputtering of material from a source of the magnetron onto a substrate, periodically modulating a power level applied to the source with at least a component comprising a frequency f which is a harmonic of the angular frequency $\omega$ of rotation of the magnet other than the first harmonic.

6 Claims, 8 Drawing Sheets

Figure 1:
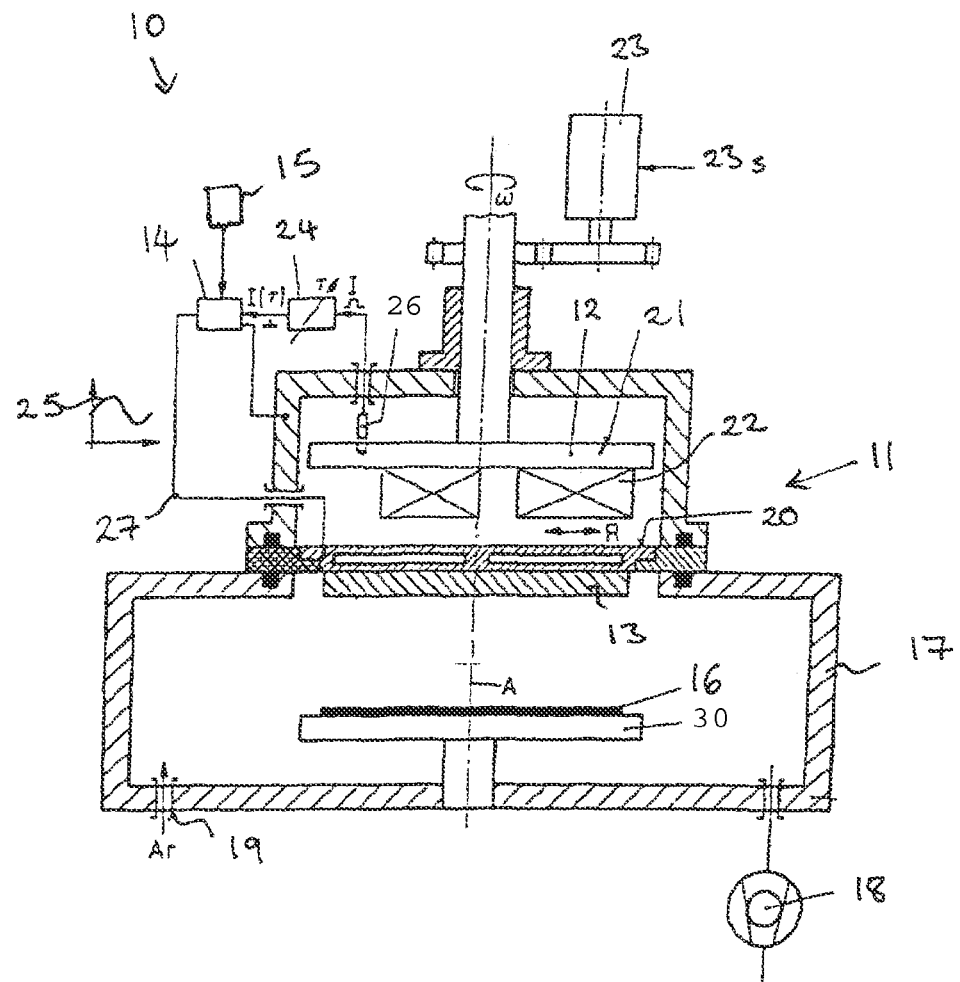

METHOD OF MAGNETRON SPUTTERING AND A METHOD FOR DETERMINING A POWER MODULATION COMPENSATION FUNCTION FOR A POWER SUPPLY APPLIED TO A MAGNETRON SPUTTERING SOURCE

A method of magnetron sputtering and a method for determining a power modulation compensation function for a power supply applied to a magnetron sputtering source The present application relates to a method of magnetron sputtering, in particular a method of magnetron sputtering in which a film is deposited on a substrate using a magnetron comprising a source and a rotatable magnet.

Magnetron sputtering is a well-known technique using crossed electric and magnetic fields for generating a plasma tunnel above a target providing a source of material which is to be sputtered. The electric field may be produced by applying a bias with a direct current (DC), alternating current (AC), Radio Frequency (RF) or DC with superimposed AC supply. Such methods are widely used for thin film deposition. Many applications involve coating single round substrates, e.g. silicon wafers or disks (optical, magnetic etc). Magnetrons with a rotating magnet assembly may be used for this purpose.

In some applications, a highly uniform film thickness is desirable. However, several physical effects limit the uniformity which is realizable in practice. One effect which can limit the thickness uniformity of a deposited film is the radial erosion of the target and its change over the lifetime of the target. A magnetron with one or more movable permanent magnets may be used to adjust the radial distribution of the thickness of the film on the substrate by partially compensating for the effect of radial erosion of the target.

Other physical effects influencing the film uniformity can be caused by chamber geometry, gas introduction and pumping and so on. The homogeneity of the crystal structure of the sputtered target, such as the grain size and preferred crystal orientation, can also affect the thickness uniformity of the deposited films. Furthermore, the sputtering yield may be different in various crystallographic directions of the grains in the target. This can result in an undesirable thickness non-uniformity on the substrate. The distribution of this non-uniformity may have an apparently irregular shape.

Some of the angular thickness non-uniformity may be compensated by using a periodic modulation of the power delivered to the source by the power supply which has the same frequency as and is synchronized in phase with the rotation of the magnet. The power modulation may comprise a sinus or cosinus function. Such an arrangement can compensate for a tilt (slope, skew) in the thickness uniformity pattern observed for the deposited film. However, some thickness non-uniformity can still be present.

It is, therefore, desirable to provide a method of magnetron sputtering with which a film can be deposited on a substrate with an improved thickness uniformity.

A method of magnetron sputtering is provided which comprises rotating a magnet of a magnetron with an angular frequency $\omega$, and during sputtering of material from a source of the magnetron onto a substrate, periodically modulating a power level applied to the source with at least a component comprising a frequency f which is a harmonic of the angular frequency $\omega$ of rotation of the magnet other than the first harmonic.

The periodically modulated power which is applied to the source according to the method of the application provides an improvement in the thickness uniformity of the film, in particular an improvement of the angular thickness distribution.

The angular frequency of rotation of the magnet $\omega$ and the time-dependent modulation of the power supply may be f. This periodic modulation is described herein as the first harmonic of the angular frequency $\omega$ of the magnet rotation if the time dependent modulation frequency of the power level is the same as the angular frequency of the rotation of the magnet, i.e. when $f=\omega$. The second harmonic frequency of the power level is $2\omega$ the third harmonic frequency of the power level is $3\omega$ and so on.

In a further embodiment, the periodic modulation of the power level comprises one or more further components, each comprising a frequency f which is a harmonic of the angular frequency $\omega$ of rotation of the magnet and which is different to the first frequency. The periodic modulation, therefore, comprises two or more components of differing time-dependent frequency. At least one of these components is not the first harmonic of the angular frequency of the rotation of the magnet. In am embodiment, the first and second harmonics are used. In a further embodiment, the power modulation comprises components comprising the first, second, third and fourth harmonics. Various forms of periodic modulation may be used. The periodic modulation may have the form of, or approximate the form of, a cosine with a phase shift, a sine with a phase shift or the sum of a cosine and a sine.

In embodiments in which the periodic modulation component comprises a phase shift, the periodic modulation component may comprise a first frequency $f_1$, a first amplitude a and a first phase shift $\delta$ with respect to the angular frequency $\omega$ of the magnet, the first frequency $f_1$ being a harmonic of the angular frequency $\omega$ other than the first harmonic.

In a further refinement of this embodiment, the periodic modulation may comprises one or more further components. The further component may comprise a second frequency $f_2$, a second amplitude a and a second phase shift $\delta_2$ with respect to the angular frequency $\omega$ of the magnet, the second frequency $f_2$ being a different harmonic of the angular frequency $\omega$ compared to the first frequency $f_1$.

The first frequency $f_1$ may be one of the second, third and fourth harmonics of the angular frequency $\omega$ and the second frequency $f_2$ one of the first, third and fourth harmonics of the angular frequency $\omega$.

A multi-stage sputtering method is also provided in which the periodic power modulation applied to the power level differs in at least two of the stages. In this context, stage is used to mean sequential sputtering periods of time.

In particular, in a first step the power level comprises a periodic modulation having a first frequency $f_1$ which is a harmonic of the angular frequency $\omega$ and in a second step the power level comprises a periodic modulation having second frequency $f_2$, the second frequency $f_2$ being a different harmonic of the angular frequency $\omega$ compared to that of the first frequency $f_1$.

This method can be used to improve the radial uniformity of the thickness of a film deposited on a workpiece such as a wafer. In this embodiment, the harmonic modulation approach with modification of radial uniformity. For example, when the angular thickness uniformity for a small radius at the workpiece differs strongly from that at the workpiece edge, one can divide the deposition process into two or more stages (time steps). At each stage, the radial erosion profile is different so that a suitable power modulation function is used for each stage.

To compensate for radial non-uniformity in the thickness, the first stage is performed at radial erosion which is strong at the target central part, resulting in radial thickness uniformity with pronounced maximum at the center of the workpiece. Then, a second stage is performed at radial erosion which is weak at the target central part, resulting in radial thickness uniformity with pronounced minimum at the center of the workpiece.

The final radial uniformity is adjusted by proper selection of times and/or powers of the two stages. The power modulation function used in the first stage is optimized for compensation of angular uniformity in the inner part of the workpiece while the second stage uses a different power modulation function optimized for compensation of angular uniformity in the outer part and edge.

In a further embodiment, the component of the periodic power modulation comprises an amplitude selected to compensate for a difference in the angular non-uniformity of the thickness measured for a film of the sputtered material deposited on a substrate using a single harmonic of the angular frequency, a zero phase shift and a pre-determined amplitude compared to a reference film of the sputtered material deposited on a substrate without modulation of the power supply.

In a further embodiment, the component of the periodic power modulation comprises a phase shift selected to compensate for a difference in the angular non-uniformity of the thickness measured for a film of the sputtered material deposited on a substrate using a single harmonic of the angular frequency, a zero phase shift and a pre-determined amplitude compared to a reference film of the sputtered material deposited on a substrate without modulation of the power supply.

The component of the periodic power modulation may comprise an amplitude and a phase shift selected to compensate for a difference in the angular non-uniformity of the thickness measured for a film of the sputtered material deposited on a substrate using a single harmonic of the angular frequency, a zero phase shift and a pre-determined amplitude compared to a reference film of the sputtered material deposited on a substrate without modulation of the power supply.

The thickness of the film deposited with periodic modulation according to one of the previously described embodiments as well as the thickness of the reference film may be determined by techniques such as Fourier integration or least squares approximation.

In a further embodiment, the periodic modulation applied to the source is determined by applying a power modulation compensation function comprising an amplitude and phase shift. The power modulation compensation function is the vector sum of a reference power modulation and a differential power modulation.

The differential power modulation is determined by measuring the difference between the thickness of a first film and a reference film. The first film is a film of the sputtered material deposited on a substrate using a harmonic of the angular frequency, a first phase shift and a first amplitude. The reference film of the sputtered material deposited on a substrate using a reference power modulation comprising said harmonic of the angular frequency, a reference phase shift and a reference amplitude.

In place of the parameter of the thickness, the non-uniformity of the film may also be determined using measurable parameters such as the sheet resistance and optical thickness. These parameters are at least in part dependent on the physical thickness of the film of sputtered material.

In a further embodiment, the periodic modulation applied to the source includes a power modulation compensation function comprising an amplitude and phase shift which is determined by calculation rather than the measured difference between deposited films.

The power modulation compensation function may be determined by rotating a simulated two dimensional erosion profile of the magnetron at the harmonic frequency and calculating the non-uniformity of the thickness of the deposited film. The difference between this non-uniformity and a theoretical film without thickness non-uniformity provides the power modulation compensation function.

Embodiments will now be described with reference to the accompanying drawings.

Figure 2:
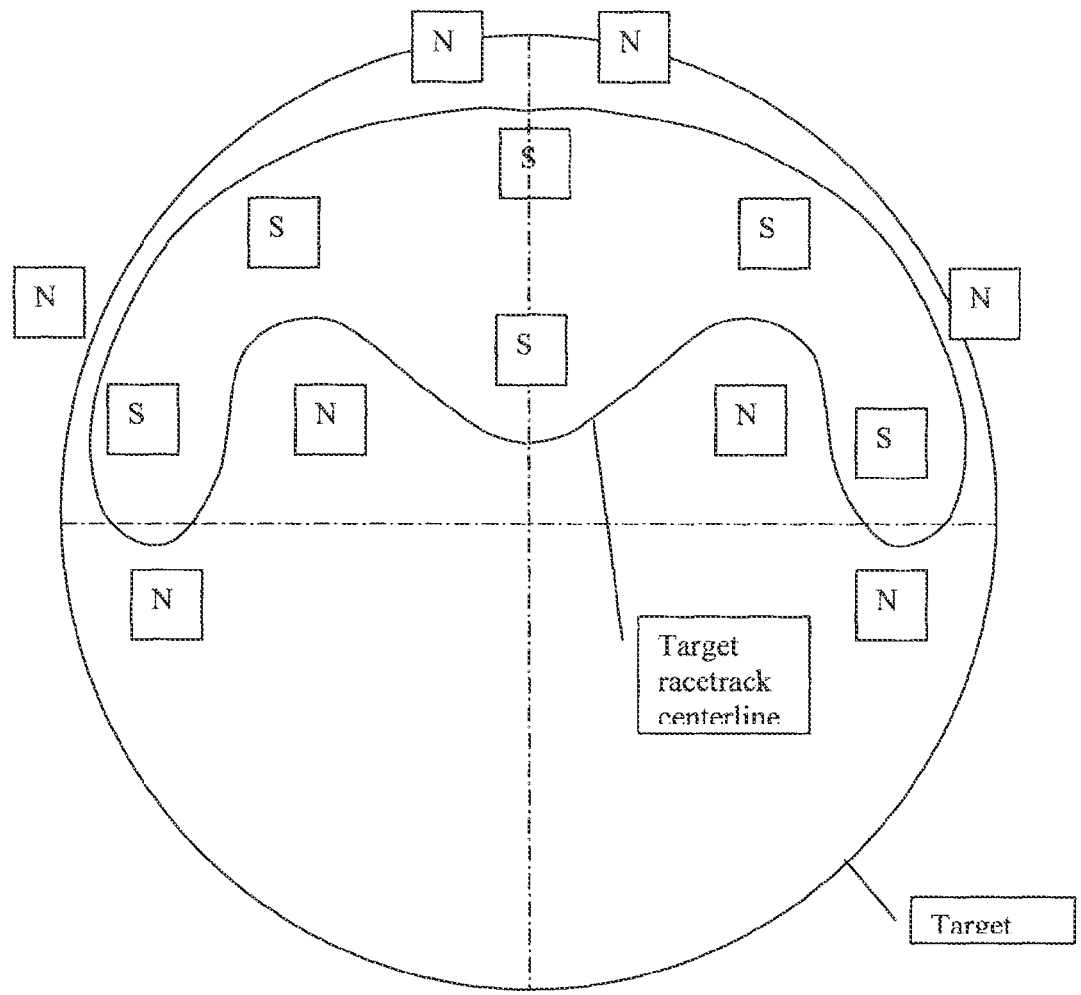
Figure 3:
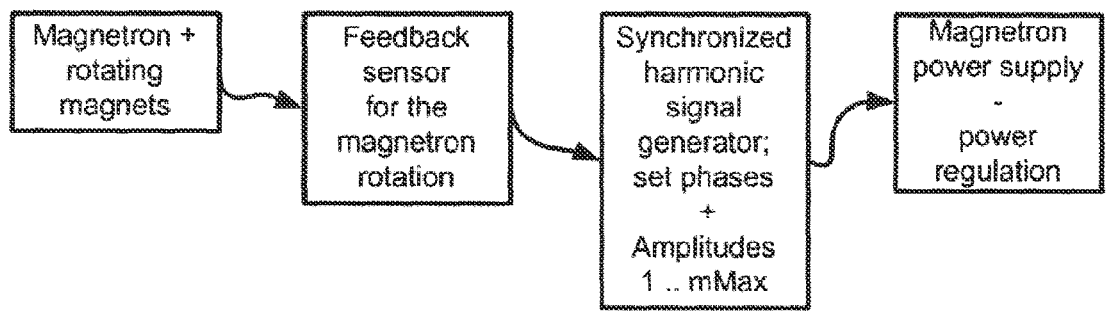
Figure 4:
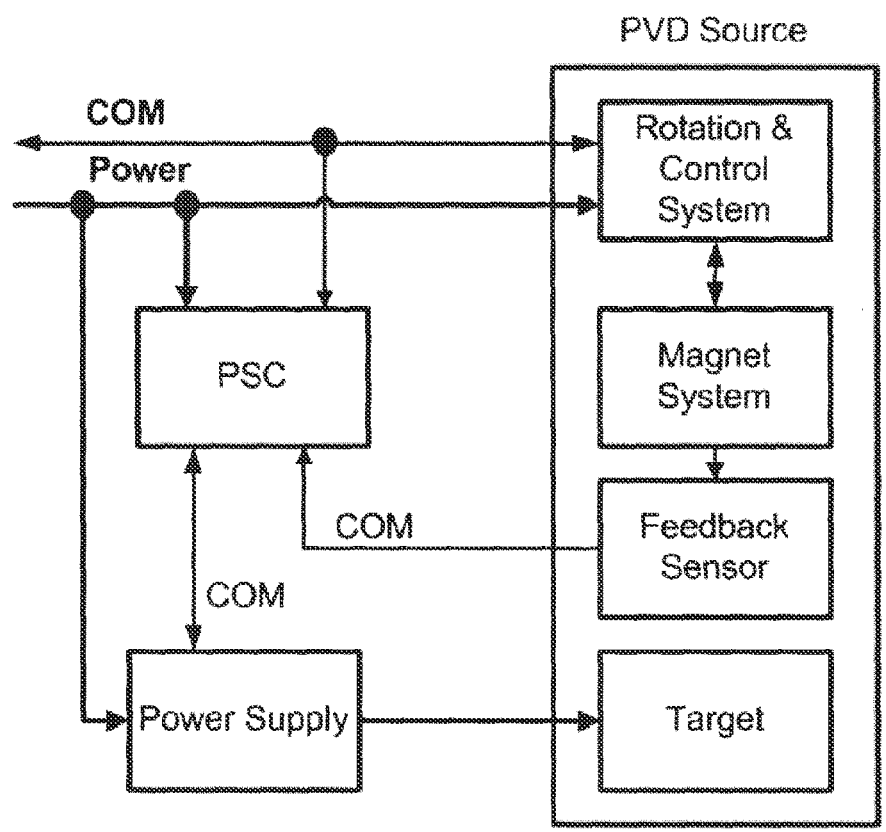
Figure 6A:
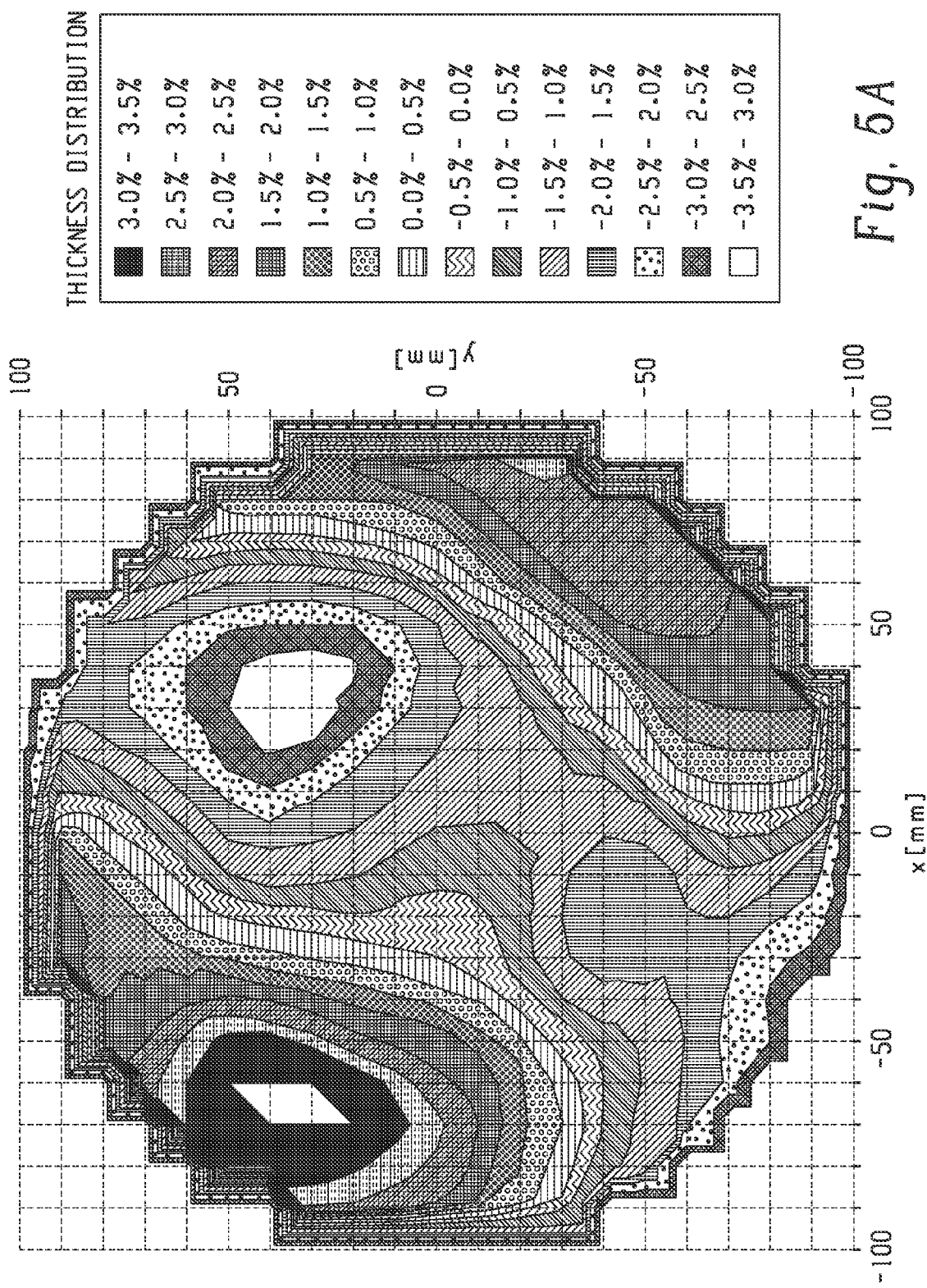
Figure 5B:
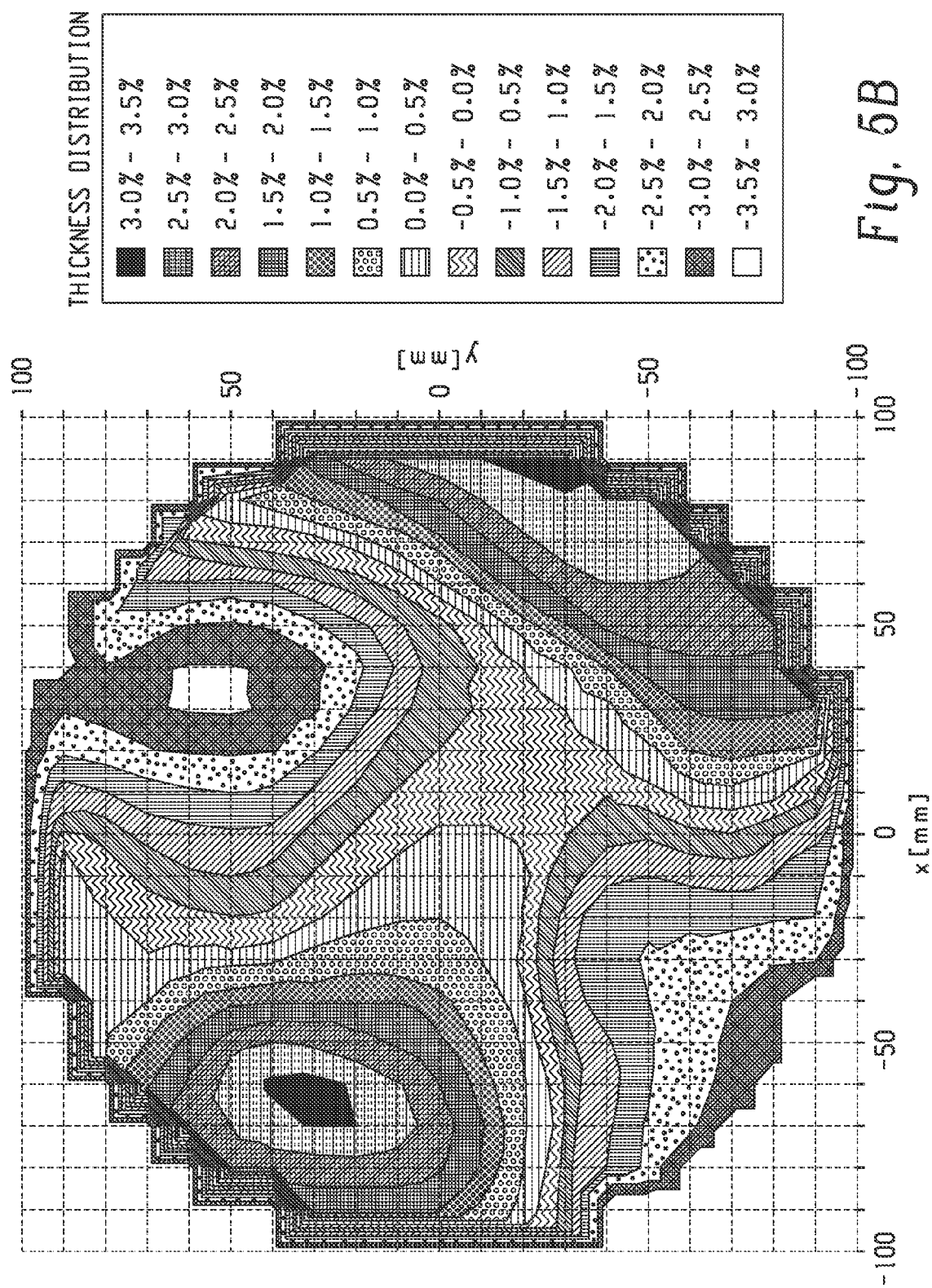
Figure 6:
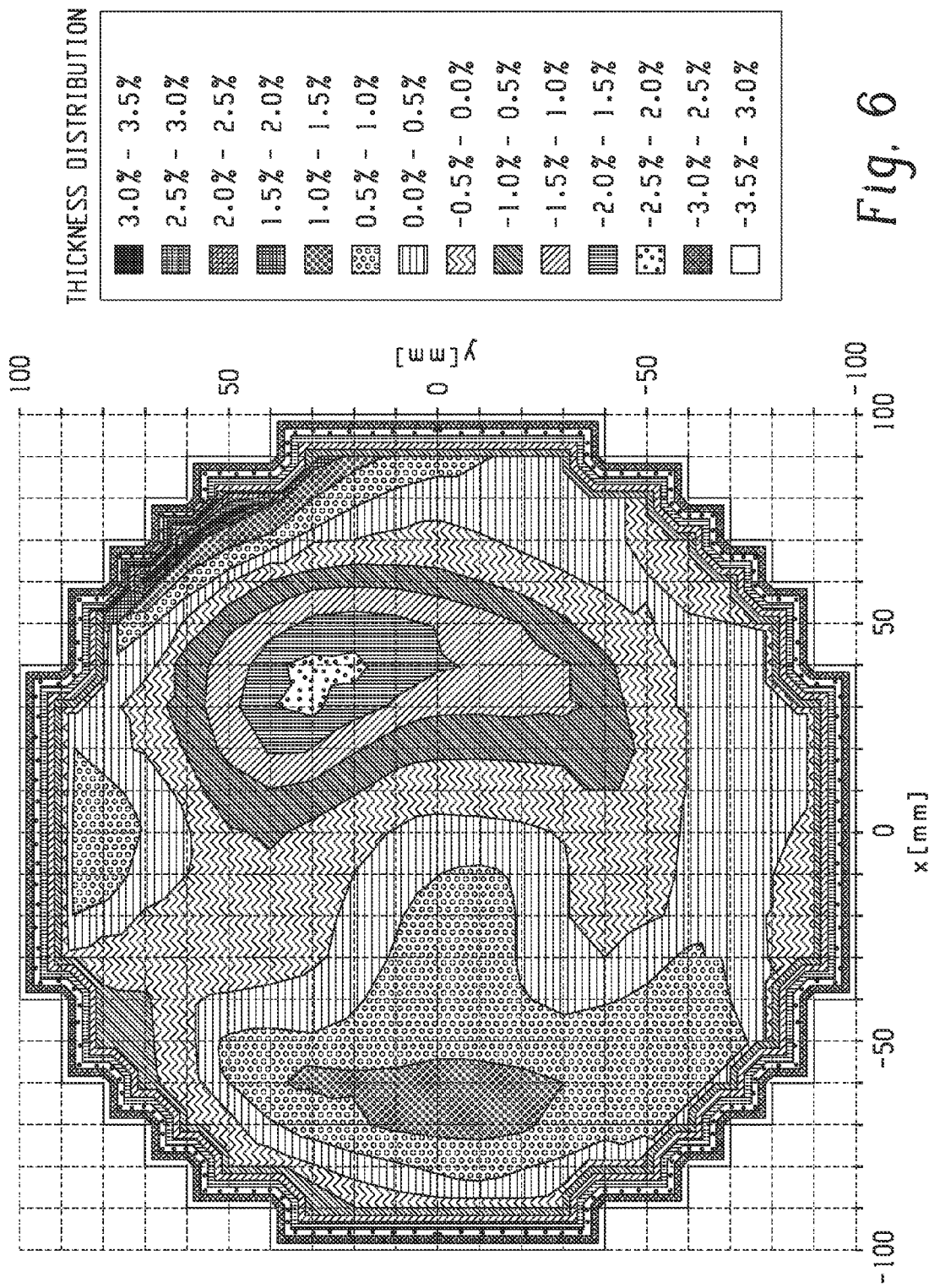

FIG. 1 illustrates a schematic diagram of magnetron sputtering apparatus including a rotatable magnet, FIG. 2 illustrates a rotatable magnet suitable for use in the apparatus of FIG. 1, FIG. 3 illustrates a block diagram of a power control system for the magnetron sputtering apparatus, FIG. 4 illustrates a schematic diagram of a power control system for the magnetron sputtering apparatus, FIG. 5(a) illustrates the thickness uniformity measured for a Ta film deposited without power modulation, FIG. 5(b) illustrates the thickness uniformity measured for a Ta film deposited with a power modulation synchronized with the rotation of the magnet, FIG. 6 illustrates the thickness uniformity measured for a Ta film deposited with a power level compensated with power modulations corresponding to the first, second, third and fourth harmonics of the angular rotation of the magnet.

Figure 7A:
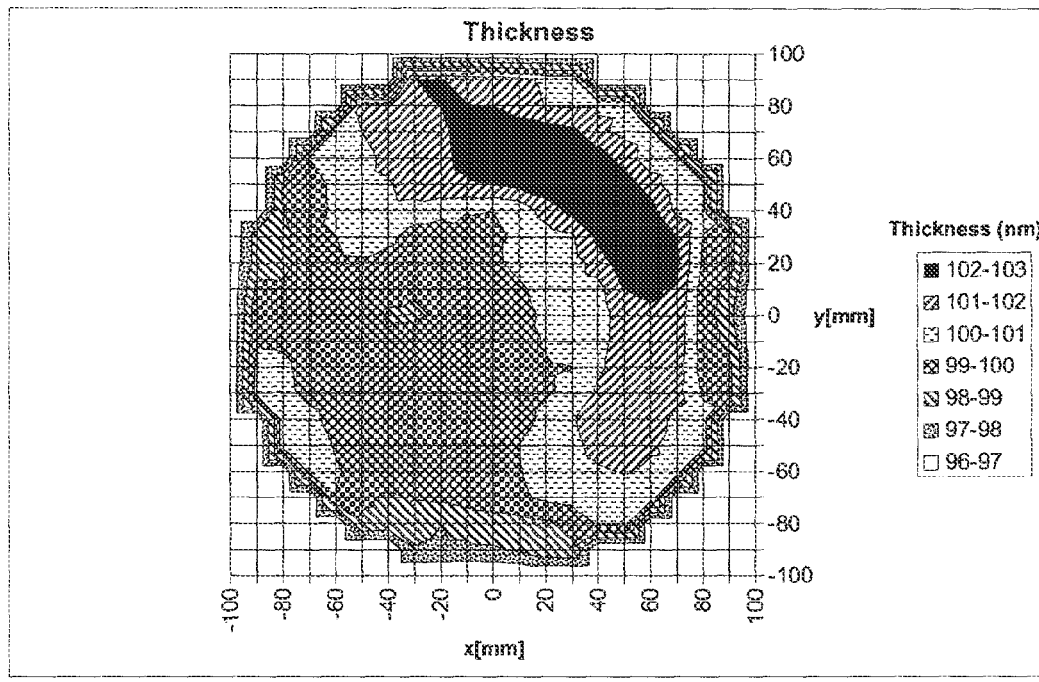
Figure 7B:
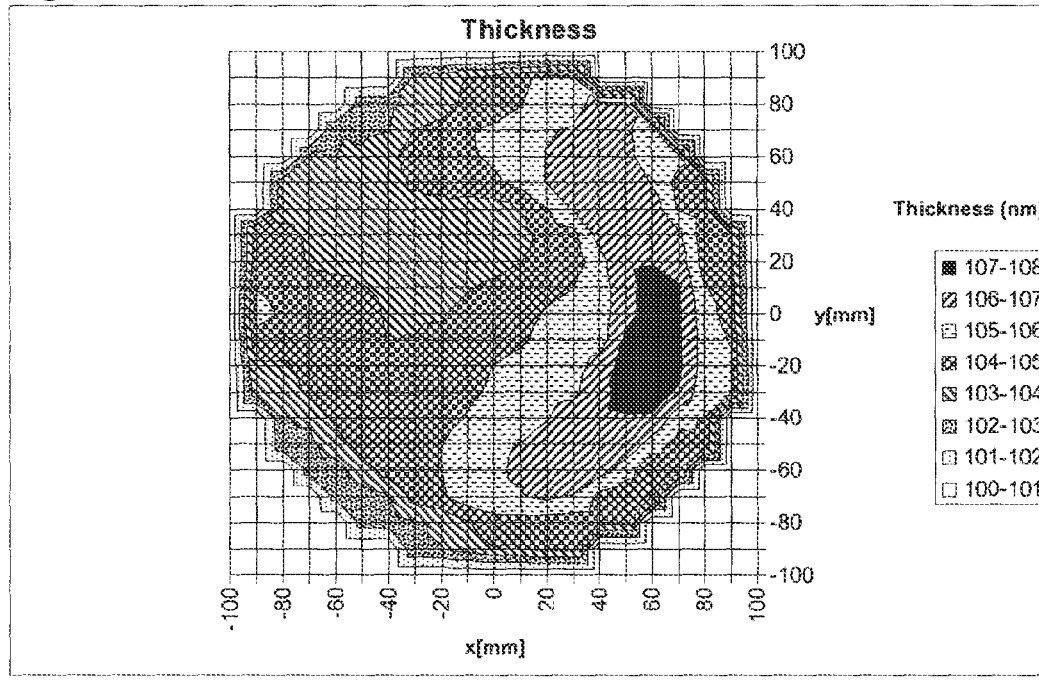
Figure 8:
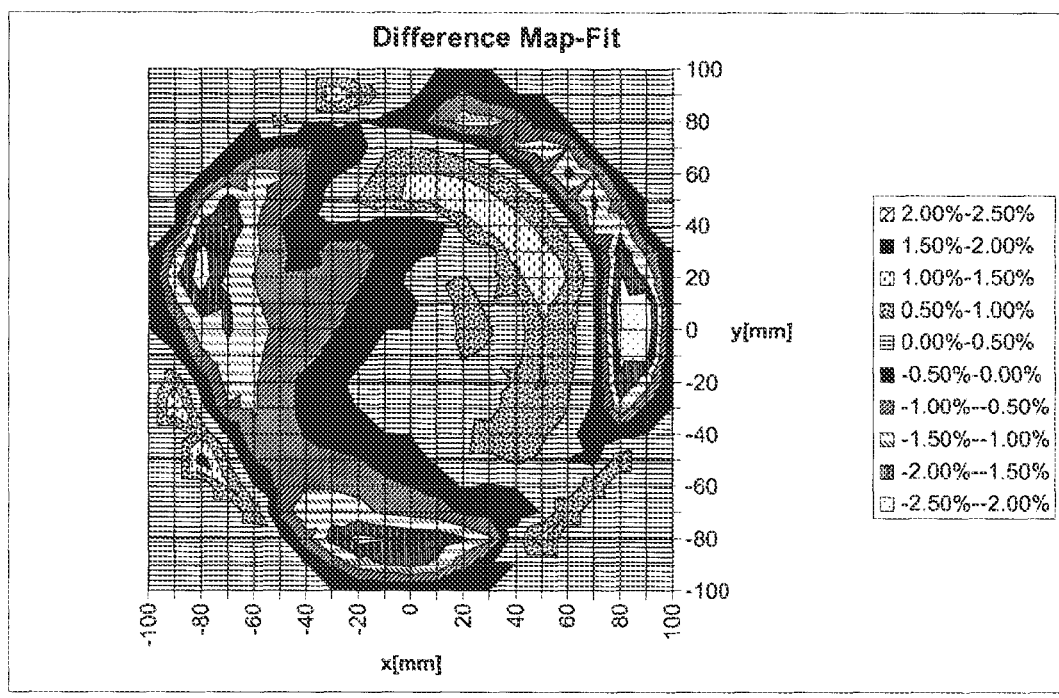

FIG. 7 illustrates the thickness uniformity measured for two comparison films deposited from a tungsten target without power modulation, FIG. 8 illustrates the thickness uniformity measured for a AlN comparison film deposited using a sinus power modulation synchronized with a rotating magnet, In the method of magnetron sputtering according to the invention, the power supplied to the source or target includes a periodic power modulation which includes at least one power modulation compensation component which is a harmonic of the angular rotation of the magnet other than the first harmonic.

The angular frequency of rotation of the magnet is $\omega$ and the time-dependent modulation of the power supply is f. A typical frequency f and angular frequency $\omega$ is 5 Hz. The first harmonic of the power level is defined as $f=\omega$, i.e. the time dependent modulation frequency of the power level is the same as the angular frequency of the rotation of the magnet. The second harmonic frequency of the power level is 2 $\omega$, the third harmonic frequency of the power level is 3 $\omega$ and so on.

In the following embodiments, the periodic power modulation has the form of a cosinus function with a phase shift. However, a sinus function with a phase shift or the sum of a cosinus function and a sinus function or an exponential function with imaginary argument may also be used.

The periodically modulated power which is to be applied is determined as follows:

The Fourier series for the thickness function on the workpiece or substrate rim as function of angle $\varphi$ may be described as $$AngularRim = ampRim_0 + \sum_{n=1}^{\infty} ampRim_n \cdot \cos(n \cdot \varphi - phaseRim_n),$$

where $ampRim_n$ is the amplitude of the n-th harmonic frequency, $phaseRim_n$ is phase of the n-th harmonic frequency, and $ampRim_0$ is the average thickness on the workpiece rim.

Similarly, a general periodic power modulation function of time t with angular frequency $\omega$ of magnet rotation may be described as:

$$PowerCompFunction =$$
$$ampPow_0 + \sum_{n=1}^{\infty} ampPow_n \cdot \cos(n \cdot \varpi \cdot t - phasePow_n),$$

where $ampPow_n$ of the n-th harmonic frequency
$phasePow_n$ are amplitude and phase of the n-th harmonic frequency, and
$ampPow_0$ is the time average power over the rotation period.

In an embodiment, the power compensation function is determined as follows:
1. Limit the number of harmonic frequencies to nMax:

$$PowerCompFunction =$$
$$ampPow_0 + \sum_{n=1}^{nMax} ampPow_n \cdot \cos(n \cdot \varpi \cdot t - phasePow_n),$$

where nMax >1, typically nMax=2 to nMax=10, most preferred is nMax=4.

2. Assuming that the workpiece thickness as function of radius r and angle φ is a sum of a radial function Radial(r) with a product of an radially-dependent amplitude Amp(r) and a pure angular function Angular(φ):

Thickness(r,φ)=Radial(r)+Amp(r)·Angular (φ), where Amp (0)=0

3. Assuming the form of the angular function Angular(φ):

$$Angular(\varphi) = \sum_{n=1}^{nMax} amp_n \cdot \cos(n \cdot \varphi - phase_n)$$

4. Assuming that the radial function Radial(r) and Amp(r) depend linearly on the average power $ampPow_o$.
5. Assuming that the amplitude and phase $amp_n$ and $phaseRim_n$ of the n-th harmonic (n=1 to nMax) depend on the amplitude and phase $ampPow_n$ and $phasePow_n$ of the corresponding n-th harmonic component of the power modulation function but are independent of the other harmonic components of the power modulation function.

The function Angular(φ) can be determined as $$\frac{Thickness(r, \varphi) - \text{Radial}(r)}{Amp(r)}$$

for known radial functions Radial(r) and Amp(r).

The radial function Radial(r) uses either an analytic expression describing the real deposition rate form or some kind of an approximate function like a cubic spline, or a polynomial expression such as Chebyshev or Legendre polynomials. Coefficients of the function Radial(r) can be determined from measured data by least square approximation or by integration in case of orthogonal base functions.

Similarly, as the function Angular(φ) is a periodic function of angle φ, it is possible to determine the parameters sensitivity $ampSens_n$ and $angSens_n$ for the n-th harmonic frequency either by Fourier analysis or by least square approximation.

As an example of the function Amp(r), one can take simply Amp(r)=r so that the thickness (r,) may be described by:

$$\text{Thickness}(r, \varphi) = \text{Radial}(r) + r \cdot \sum_{n=1}^{nMax} amp_n \cdot \cos(n \cdot \varphi - phase_n)$$

In an embodiment, the power modulation function is constructed as follows:

A workpiece $W_0$ is first produced without any modulation, using only constant power $ampPow_0$.

Then, for each harmonic frequency $f_n$, a Workpiece $W_n$ is deposited with a power modulation function $ampPow_0 + ampPow_n \cdot \cos(n \cdot \overline{\omega} \cdot t)$, using a known (in this case zero) phase shift and a given amplitude $ampPow_n$ while all other harmonic frequencies have zero modulation amplitude.

Then it is possible to determine the thickness difference between the Workpieces $W_n, W_0$ in the form:

Thickness$W_n$−Thickness$W_0$=r·(ampSens$_n$·cos(n·φ−angSens$_n$))

The relative thickness difference for r>0

$$\frac{1}{r}(ThicknessW_n - ThicknessW_0)$$

is a pure function of angle φ, so it is possible to determine the parameters sensitivity $ampSens_n$ and $angSens_n$ for the n-th tarmonic frequency either Fourier integration or by least square approximation as mentioned above. This way, a sensitivity $sens_n$ is determined:

$sens_n = ampSens_n / ampPow_n$

Having the sensitivities $sens_n$ and $angSens_n$, the power compensation function can be constructed as $$PowerCompFunction =$$
$$ampPow_0 + \sum_{n=1}^{nMax} (-amp_n / sens_n) \cdot \cos(n\varpi t - phase_n + angSens_n),$$

knowing the $amp_n$ and $phase_n$ determined from a workpiece deposited without any power modulation, such as the workpiece $W_0$.

The angular sensitivity results from $angSens(n) = (phase(n) - phasePow(n))$.

For a zero phase of the power modulation function, phasePow(n)=0, therefore, angSens(n)=(phase(n)−0).

The negative sign for the amplitude then results in the compensation effect.

FIG. 1 illustrates apparatus 10 suitable for carrying out the method of magnetron sputtering according to the invention.

The apparatus 10 includes a magnetron 11 with a rotatable magnet assembly 12 and a target 13, a means 14 to produce a periodic power modulation in a form of harmonic composition of first nMax harmonic functions with defined amplitudes and phases (or at least approximating such a function), and a synchronization tool 15 that enables the phase synchronization of the periodic power modulation with the magnet rotation.

The target 13 and substrate 16 onto which a film of material of the target 13 is to be deposited are arranged in a vacuum chamber 17 facing one another. In the arrangement of FIG. 1, the substrate is positioned on the base 30 of the chamber 17 and the target 13 is positioned above it. Both the target 13 and substrate 16 remain stationary during sputtering in the embodiments described in the present application.

The vacuum chamber 17 is evacuatable via a pumping means 18 and also includes a gas line 19 for a working gas, preferably argon. A reactive gas for reactive magnetron sputter coating may also introduced into the vacuum chamber 17.

The rotatable magnet assembly 12 is positioned outside of the vacuum chamber 17 and behind a target back plate 20 on which the target 13 is positioned. The axis of rotation A of the magnet is concentric with the centre of the target 13 and substrate 16.

The rotatable magnet assembly includes a rotationally movable magnet carrier plate 21, driven about a central axis A, with a configuration of permanent magnets 22 disposed asymmetrically with respect to it and for example kidney-shaped in top view-reference is made to FIG. 2. The magnets 22 of the magnet configuration can rotated, as indicated at R, at an angular frequency $\omega$, around axis A.

The rotational movement of the magnet assembly 12 generated by a motor with control input 23s is scanned by means of a detector configuration 23. The scanning pulses I of detector unit 23 are settably time-delayed X at a unit 24; the output side, time-delayed pulses $I(\tau)$trigger or synchronize the, for example, periodically modulated signal 25.

The amplitude and phase shift of the periodically modulated signal component of 25 is set at a further control input s at generator 26.

FIG. 2 illustrates a top view of the rotatable magnet 22 illustrated in FIG. 1. The form of the magnet 22 is characterized by a magnetic tunnel forming an erosion racetrack that is almost entirely concentrated in one half-circle of the target. This allows both radial uniformity adjustment and higher sensitivity to power modulation.

The method provides a periodic power modulation of the power supplied to the source during sputtering. In particular, the power is periodically modulated in time at a frequency which is a harmonic of the angular frequency of the rotation of the magnet with an amplitude and a phase shift. This can be achieved using power control apparatus as illustrated in FIGS. 3 and 4.

FIG. 3 illustrates a block diagram of a scheme of synchronisation and power modulation suitable for use in the embodiment described herein. The scheme includes a magnetron with rotating magnets 22, a feedback sensor 23 for the magnetron rotation, a synchronized harmonic signal generator 26 which is able to set the phase and amplitude and a magnetron power supply 27 with power regulation.

The scheme is stated in more detail in FIG. 4 in which the communication and data flow lines together with the power lines are illustrated. The deposition system includes the rotation and control system 12, the magnet system 22, the feedback sensor 23 and the target 13. The scheme further includes the power supply 27 applied to the target 13 and the power supply controller 26 which receives signals from the feedback sensor 23 and the power supply 27 which enables the time-dependent frequency and phase of the periodically modulated power level 25 supplied to the target 13 to the synchronized with the angular rotation of the magnet system 22. The power supply controller 26 also controls the amplitude of the modulation and the form of the periodic modulation, for example a sign or cosine wave, of the power 25 supplied to the target 13.

In the following embodiments, a single-wafer processing tool, in particular, a ClusterLine II from OC Oerlikon Coating, using the cathode ARQ151 with Ta target of 300 mm diameter is used to deposit films onto a substrate. This apparatus includes a power control and rotatable magnet control according to the scheme of FIGS. 3 and 4 and the rotatable magnet shown schematically in FIG. 5.

The films were deposited under the following conditions. The first harmonic has a frequency of 5 Hz, the non-modulated set power is 200 W at 262V and 0.76 A and a 130 sccm Ar flow and a deposition time of 70 s was used. The amplitude of the periodic modulation is given as a percentage of the power set point, i.e. 200 W.

The effect of using a periodically modulated power supply applied to the target and the effect of using a periodically modulated power supply with a power compensation function on the thickness uniformity is illustrated in FIGS. 5 and 6.

FIG. 5(a) illustrates a comparison example and, in particular, illustrates the thickness uniformity measured for a Ta film deposited without power modulation. The thickness uniformity is ±4.5%.

FIG. 5(b) illustrates the thickness uniformity measured for a Ta film deposited with a power modulation synchronized with the rotation of the magnet, i.e. the power modulation was performed at a frequency which corresponds to the angular frequency of the magnet rotation. This is termed the first harmonic. The thickness uniformity is ±3.7% which represents a slight improvement over the non-compensated film of FIG. 5a.

FIG. 6 illustrates the thickness uniformity measured for a Ta film deposited with a power level compensated with power modulations corresponding to the first, second, third and fourth harmonics of the angular rotation of the magnet. The thickness uniformity is ±2.3% which is an improvement over the film in which the power modulation compensation function includes a component only for the first harmonic.

The power compensation functions used when sputtering the film illustrated in FIG. 6 are determined by analysis, in particular, by determining the sensitivity of the first 4 harmonic frequencies by analysis.

Table 1 shows sensitivities determined in case of sputtering tantalum using harmonic power modulation in the range 10% to 40% of the set power level which in this embodiment is 200 W. For example, the power level ranges from 180 W to 200 W for a modulation of 10%. In each case, only a single harmonic was used.

The thickness of the film on the substrate was measured at a selected radius and angle for the film sputtered using a periodic power modulation including a component having the frequency of the single harmonic and a film deposited without power modulation. The difference in thickness at this position between the two films was calculated and the functions defined above were used to calculate sensitivity sens and angular sensitivity (deg).

Table 2 illustrates an analysis of the uncompensated Ta deposited wafer and comparison with power compensated ones, either fully with all 4 harmonics or with selected ones only.

The uniformity of the thickness measured over the substrate is given for an uncompensated film which was deposited without power modulation, a compensated film which was deposited using a power supply including power compensation functions for each of the first four harmonic frequencies as well as for partly compensated films which were deposited using a power supply including power compensation functions only for the harmonics indicated.

Table 2 also shows the values of the amplitude and phase of the harmonics measured on the film. The values given for the uncompensated film indicate the values of the amplitude and phase which should be compensated by means of the power compensation function.

The highest thickness uniformity, as described by a mean of 0.90% and mean range of 4.60%, was observed for the film deposited using a power supply including power compensation functions for each of the first four harmonic frequencies.

The $2^{nd}$ harmonic has the highest amplitude on the wafer, so it can be expected that it is the most significant one. In fact, the film uniformity remains almost the same using combination of 1st and 2nd as compared to $2^{nd}$ harmonic only. When only the 3rd & 4th harmonic have been used, uniformity is only slightly improved compared to uncompensated deposition. Nevertheless, the wafer confirms that the amplitudes of both the 3rd & 4th harmonic fall down very low to 0.01%.

The amplitudes and phases of all uncompensated harmonics remain almost the same as in the original deposition. This confirms that the assumption of influencing only the same harmonic on the workpiece as used in modulating the magnetron power is correct.

The method is not restricted to the deposition of tantalum films. The method of any of the embodiments may also be used to deposit Al, Ti, W, Cr, Ru, Cu, Si, SiC, TiN, ferromagnetic alloys of Fe, Co and Ni as well as precious metals such as Au, Pt, Ag. It may also be used for reactive sputtering to produce films of TiN, AlN, $Al_2O_3$, ITO, PZT.

FIGS. 7 and 8 illustrate further comparison examples of films deposited without periodic power modulation including at least one component having a harmonic frequency other than the first harmonic.

FIG. 7 illustrates a first comparison example of films deposited without power modulation. In particular, FIG. 7 illustrates the thickness measured for two films sputtered from a tungsten target. To fabricate the second film, the target was rotated 45° clockwise with respect to the position of the target used to fabricate the first film. FIG. 7 illustrates, that the non-uniform thickness distribution of the film rotates with the target rotation.

FIG. 8 illustrates a second comparison sample in which a ALN film was deposited by reactive sputtering of an aluminium target in a nitrogen atmosphere using a power modulated with a sinus function. The frequency of the modulation was synchronized with the rotation of the magnet of the magnetron.

FIG. 8 illustrates that a non-uniform thickness variation in the form of a tilt in a direction across the substrate has been compensated. However, the distribution includes an azimuthally arranged non-uniform thickness variation with three deep minima at about 3 O'clock, 6 O'clock and 10 O'clock.

In the above embodiments, the power modulation function was determined by comparing the thickness non-uniformity distribution of each single harmonic with an uncompensated film. However, the power modulation compensation function may also be determined according to one of the following further embodiments.

The determination of the sensitivities $sens_n$ and $angSens_n$, may be done only once for a given process with its geometry and magnetron design. In later use, for example by installing a new target of the same material but with somewhat different homogeneity, a single workpiece $W_0$ is enough to determine the power compensation function.

However, some parameters in the deposition apparatus may change slowly with target lifetime, for example change of target grain orientation with depth, target recrystallization, deposition, coating thickness on inner part of the chamber among others. Therefore, the optimum power compensation function may also slowly change.

To compensate for changes in the parameters over time, one method is to use a test workpiece with zero modulation and determine a new power compensation function as described above.

In a further embodiment, a power compensation function to compensate for changes in deposition parameters over time is calculated based on differential measurement. In this embodiment, the amplitudes and phases used to produce the last workpiece are known. A new workpiece is produced and a differential power compensation function may be determined by comparing the last workpiece and the new workpiece. A new power compensation function is constructed as vector sum of the last power compensation function with the differential one and used in subsequent production of workpieces.

The method according to one of the previous described embodiments may be used when magnetron sputtering when the electric field is produced by applying a bias with a direct current (DC), alternating current (AC), Radio Frequency (RF) or DC with superimposed AC supply.

The method according to one of the previous described embodiments may be used to manufacture multi-layer thin film structures such as multi-layer structures of integrated circuit devices, bulk acoustic wave devices, piezoelectric devices, optical devices and magnetic devices.

As used herein, the thickness of a deposited film is not limited to a continuous layer deposited on a workpiece or substrate. The method according to one of the previous the embodiments may also be used when depositing thin layers on the side walls of holes or vias having a high aspect ratio or when filling a hole or via having high aspect ratio. The depth of the hole or via is considered to represent the thickness of the film in these embodiments.

Multilayer interconnect structures of integrated circuit devices typically include the plurality of holes or vias having a high aspect ratio. The improved thickness uniformity of layers deposited using the method of one of the above embodiments enables the vias to be filled and/or the walls to be coated uniformly across the entire wafer. Variations in the thickness of the deposited film may result in vias which are inadequately filled or incomplete coatings on the side walls, both of which result in a failed connection.

Typical materials used in multilevel interconnect structures for integrated circuit chips may include an adhesion layer of Tantalum deposited on the dielectric forming the vias and a subsequently deposited barrier layer such as tantalum nitride, titanium nitride, or tungsten nitride. Adhesion/barrier layer stacks formed of adhesion/barrier material such as titanium/titanium nitride or tantalum/tantalum nitride and tungsten/tungsten nitride may also be used. The via may be filled with tungsten. Aluminium may be used for the multilayer interconnects. However, copper or copper alloy may also be used.

TABLE 1

| Harmonic n | sens (%) | angSens (deg) |
|---|---|---|
| 1 | 35.5 | 358 |
| 2 | 14.2 | 110 |
| 3 | 2.66 | 64 |
| 4 | 2.63 | 16 |

The invention claimed is:

1. A method for controlling a power supply applied to a magnetron sputtering source during deposition of a film on a substrate, comprising:

determining a thickness distribution of a film deposited using a power supply applied to the magnetron sputtering source which comprises a periodic modulation having a frequency f which is a harmonic n of an angular frequency w of rotation of a magnet of the magnetron other than the first harmonic, comparing the thickness distribution to the thickness distribution of a reference film of the sputtered material deposited on a substrate without modulation of the power supply, determining an amplitude sensitivity $ampSens_n$ and an angular sensitivity $angSens_n$, wherein $sens_n = ampSens_n / ampPow_n$ for the harmonic n, determining the power compensation function PowerCompFunction according to $PowerCompFunction = (-amp_n / sens_n) \cdot \cos(\overline{n\omega}t - phase_n + angSens_n)$, where $amp_n$ is an amplitude determined from the reference film, $phase_n$ is a phase determined from the reference film, and $n\omega t$ is a product of the harmonic, the angular frequency of rotation, and the time with respect to the power compensation function, respectively, and controlling, via a power supply controller, the power supply applied to the magnetron sputtering source according to the determined power compensation function.

2. The method according to claim 1, wherein:
an amplitude is determined to compensate for a difference in the angular non-uniformity of the thickness measured for a film of the sputtered material deposited on a substrate using a single harmonic of the angular frequency, a zero phase shift and a pre-determined amplitude compared to a reference film of the sputtered material deposited on a substrate without modulation of the power supply.

3. The method according to claim 1, wherein:
a phase shift is determined to compensate for a difference in the angular non-uniformity of the thickness measured for a film of the sputtered material deposited on a substrate using a single harmonic of the angular frequency, a zero phase shift and a pre-determined amplitude compared to a reference film of the sputtered material deposited on a substrate without modulation of the power supply.

4. The method according to claim 1, wherein:
the power modulation compensation function is the vector sum of a reference power modulation and a differential power modulation.

5. The method according to claim 4, wherein:
the differential power modulation is determined by measuring the difference between the thickness of a first film of the sputtered material deposited on a substrate using a harmonic of the angular frequency, a first phase shift and a first amplitude and the thickness of a reference film of the sputtered material deposited on a substrate using a reference power modulation comprising said harmonic of the angular frequency, a reference phase shift and a reference amplitude.

6. The method according to claim 1, wherein:
the power modulation compensation function is determined by rotating a simulated two dimensional erosion profile of the magnetron at the harmonic frequency and calculating the non-uniformity of the thickness of the deposited film.

\* \* \* \* \*

UNITED STATES PATENT AND TRADEMARK OFFICE
CERTIFICATE OF CORRECTION

PATENT NO.       : 8,574,409 B2  
APPLICATION NO.  : 13/551815  
DATED            : November 5, 2013  
INVENTOR(S)      : Stanislav Kadlec et al.

Page 1 of 1

It is certified that error appears in the above-identified patent and that said Letters Patent is hereby corrected as shown below:

On the Title page, column 1, item (73) Assignee, please replace
"oerlikon" with -- Oerlikon --

In the Specification

Column 5, line 41, please replace "amp,"
with -- $amp_n$ --

Column 6, line 45, please replace "amp, and phase,"
with -- $amp_n$ and $phase_n$ --

Signed and Sealed this  
Eleventh Day of February, 2014

Michelle K. Lee  
*Deputy Director of the United States Patent and Trademark Office*